United States Patent [19]

Mueller et al.

[11] 4,267,154

[45] May 12, 1981

[54] APPARATUS FOR MANUFACTURING HIGH QUALITY CRYSTALS

[75] Inventors: Georg Mueller, Birkenstr. 17, 8521 Langensendelbach; Herbert Weiss, Normannenstr. 26, 8000 Munich 81, both of Fed. Rep. of Germany

[73] Assignees: Georg Mueller, Langensendelbach; Herbert Weiss, Munich, both of Fed. Rep. of Germany

[21] Appl. No.: 68,219

[22] Filed: Aug. 20, 1979

[30] Foreign Application Priority Data

Sep. 29, 1978 [DE] Fed. Rep. of Germany ....... 2842605

[51] Int. Cl.$^3$ .............................................. C30B 35/00
[52] U.S. Cl. ..................................... 422/249; 422/250
[58] Field of Search ................. 164/60, 122, 289, 287; 425/435; 264/311; 13/DIG. 1; 156/DIG. 62, DIG. 83; 422/248, 245, 249, 250

[56] References Cited

U.S. PATENT DOCUMENTS

| | | | |
|---|---|---|---|
| 3,669,180 | 6/1972 | Moore et al. | 164/60 |
| 4,036,595 | 7/1977 | Lorenzini et al. | 422/249 |
| 4,116,642 | 9/1978 | Chu et al. | 756/DIG. 83 |
| 4,165,361 | 8/1979 | Milstein | 156/DIG. 83 |

Primary Examiner—Hiram Bernstein
Attorney, Agent, or Firm—Hill, Van Santen, Steadman, Chiara & Simpson

[57] ABSTRACT

Method and apparatus for manufacturing high quality crystals whereby crystal growth occurs from a melt or a gas phase and during such growth, the growing crystals are subjected to a gravitational acceleration generating and reinforcing the development of a chronologically constant, highly stationary, convection current within the growing crystal. The apparatus includes a centrifuge means having a crystal growth means mounted thereon, along with means for controlling the centrifuge and for controlling the thermal system associated with the crystal growth means.

4 Claims, 2 Drawing Figures

4,267,154

APPARATUS FOR MANUFACTURING HIGH QUALITY CRYSTALS

BACKGROUND OF THE INVENTION

1. Field of the Invention

The invention relates to a method and apparatus for manufacturing high quality crystals, particularly monocrystals, which are useful in the production of electrical and/or electro-optical components.

2. Prior Art

Extremely high standards are required of monocrystals which are utilized as the starting materials for electronic and/or electro-optical components relative to their purity, homogeneity and crystal quality. Therefore, in the manufacture of such crystals, particular attention must be directed toward the stability of the position and/or shape of the solid-liquid interphase. In addition, heterogeneous nucleation must be avoided. In order to attain stable solid-liquid interphases and avoid heterogeneous nucleation, it is necessary to establish defined material and thermal energy flows, which are adjustable by gradients of temperature and composition. As a consequence of such gradients, density gradients occur in the growth media of a crystal, i.e., a melt, which due to gravitational forces can produce convection currents in the liquid/gaseous phase. Such convection currents can be stationary (laminar) or non-stationary (oscillating or turbulent). Analagous crystal growth conditions occur whether the crystal is grown from a melt or from a gas phase.

During crystal growth, stationary convection currents have a positive effect in that they stabilize the growth speed as well as the macroscopic form of the growth interphase (i.e., phase boundary). Further, such stationary convection currents increase the material transport, which is extremely significant in terms of dopant distribution and speed of crystal growth, whether from liquids or gas phases. Non-stationary convection currents, by way of contrast, always produce a time-varying variation in the growth speed as well as in the thickness of a diffusion boundary layer. This inevitably causes a non-homogeneous crystal growth.

SUMMARY OF THE INVENTION

The invention provides a method and apparatus for manufacturing of high quality crystals from suitable liquids and gas phases yielding a crystal whereby a strong, well defined convection current is created and maintained chronologically constant throughout the growth process.

In accordance with the principles of the invention, a crystal is grown from a given crystal-yielding material with the aid of controlled thermal energy while substantially simultaneously subjecting such growing crystal to a select gravitational acceleration so as to generate and reinforce a chronologically constant, highly stationary convection current within said liquid/gaseous phase.

In accordance with the principles of the invention, such gravitational acceleration can be generated perpendicularly and/or parallel to the temperature gradient of the crystal growth system.

In accordance with a preferred exemplary embodiment of the invention, a centrifuge is utilized to produce such gravitational acceleration and a crystal growth system is associated in working relation with such centrifuge means.

DESCRIPTION OF THE PREFERRED EMBODIMENTS

The invention provides a method and apparatus for manufacture of high quality crystals, such as monocrystals, useful as initial materials in producing electronic and/or electro-optical components and comprises growing a crystal from a given crystal-yielding material with the aid of controlled thermal energy and substantially simultaneously subjecting such growing crystal to a gravitational acceleration so as to reinforce a chronologically constant, highly stationary convection current within such liquid/gaseous phase.

Figure 1:
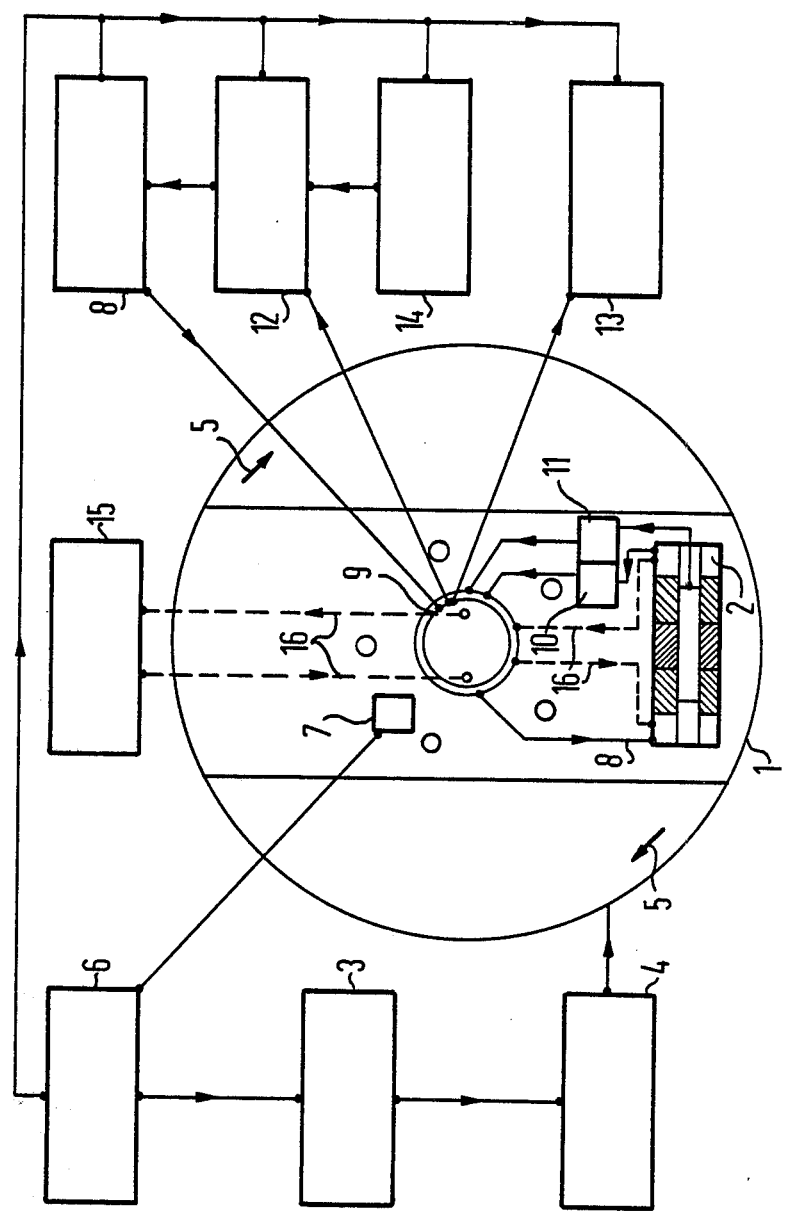
FIG. 1 is a somewhat schematic view of an arrangement utilized in the practice of the invention.
Figure 2:
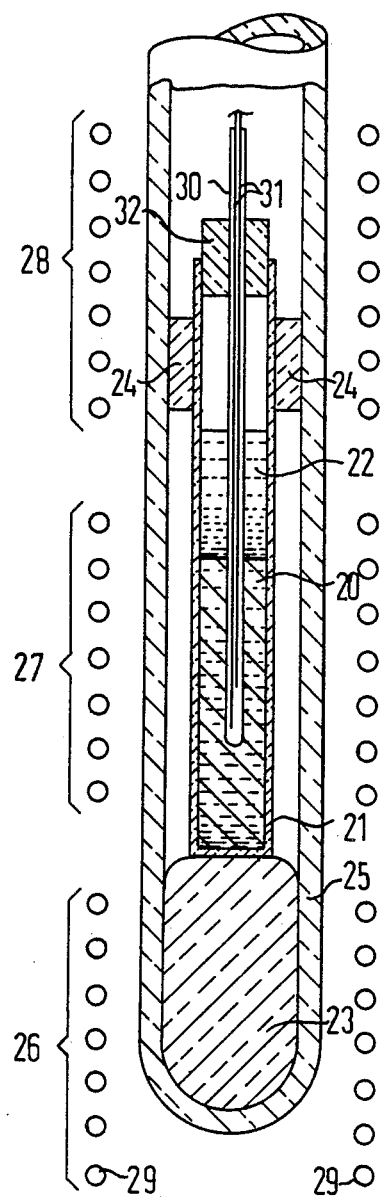
FIG. 2 is a partial elevated cross-sectional view of an exemplary crystal growth system illustrating an embodiment of the invention wherein gravitational acceleration is applied parallel to such growth system.

In accordance with the principles of the invention, a suitable crystal growth system, such as a multi-zone furnace, a zone melting apparatus, an apparatus utilizing the Czochralski method, an apparatus utilizing the Bridgman method, an apparatus utilizing the epitaxy method and other similar known crystal growth systems or apparatuses are positioned in working association with a centrifuge means. In the arrangement illustrated at FIG. 1, a multi-zone furnace 2 is illustrated as being associated with a centrifuge means 1. More particularly, the multi-zone furnace 2 is mounted on a horizontally operating arm of a centrifuge. Such crystal growth system can be mounted with its tube axes either parallel, as illustrated in FIGS. 1 and 2, or perpendicular to the direction of the centrifugal (gravitational) force generated by a centrifuge. A furnace trap counterweight (not illustrated in FIG. 1) is secured symmetrically relative to the center of rotation of the centrifuge so that the dynamic rotational force is as low as possible.

In order to provide a continuous change in the number of revolutions and to provide a jolt-free power transmission, an electronically controlled shunt-motor 4 is provided and operationally connected via a regulating means 3 to the centrifuge means 1. The shunt-motor 4 drives the centrifuge means 1 via V-belts, toothed belts, etc., as schematically indicated by arrow 5. A sensor 6 measures the number of revolutions of the centrifuge 1 in a contactless fashion via an electromagnetic proximity switch 7. An electrical power supply source 8 provides electrical current to the crystal growth system 2 via a slip or collector ring means 9 in such a manner that the power supply can be arranged and controlled in a laboratory. A control means 10 and a sensing means 11 are provided and receive signals supplied by thermo-couples. Such signals regulate or control the thermal energy (heat) supplied to the crystal growth system. The thermal electrical voltage is amplified via acceleration-proof amplifiers 10 and 11 mounted on the centrifuge into a desired volt range and is thereafter transmitted, via the slip rings 9, into the inputs of the control unit 12 and the data detection unit 13. An automatic program controller 14 is operationally coupled with the control unit and data detection unit so that a temperature gradient within the crystal growth system 2 can be "displaced" in an axial direction. A heat exchange means 15, such as a water-cooling system having input and output lines 16 is operationally coupled with the crystal growth system 2 to insure that it remains uninfluenced by air currents generated during the rotation of the centrifuge.

With an apparatus system provided in accordance with the principles of the invention, crystals having diameters of about 25 mm and lengths of 200 mm can be grown at temperatures up to 1000° C. with the substantial simultaneous application of 1 to 36 times gravity acceleration ($g^*$). Such crystals can be grown in crystal growth systems wherein the temperature gradient is oriented perpendicular to the gravitational forces or, with a system such as shown in FIGS. 1 and 2 wherein the temperature gradient is aligned parallel to the applied acceleration force.

Referring now to FIG. 2 a crystal growth system is shown which is so positioned on a centrifuge means such that the gravitational acceleration acts parallel to the growth axis, i.e., the tube axis. In this arrangement, the temperature gradient is aligned opposite the gravitational forces. For a specific temperature gradient in a growth system, there is a range of acceleration forces which can be applied so as to stabilize convection currents within such growth system. Such acceleration forces are utilized in accordance with the principles of the invention to produce high quality crystals.

In FIG. 2, the crystal material, for example comprised of indium 20, is melted in a quartz tube 21, which is sealed at one end via a stopper 32. A layer of stearic acid 22 is provided above the indium 20. The quartz tube 21 is supported along the bottom thereof by a quartz wool support member 23 and along the sides thereof via spacing elements 24, likewise consisting of quartz wool and is positioned in a larger-diameter quartz tube 25. Three distinct heating zones 26, 27 and 28 are positioned along the length of quartz tube 25. Each heating zone is separately controlled and may produce thermal energy by resistance heating. Within the indium melt 20 there is disposed, within a coaxial quartz capillary 30, at varying distances within the melt and at a distance of approximately 10 mm from one another, two shielded thermo-couples 31, consisting of nickel/nickel-chromium so as to attain a measurement of the temperature gradient within the melt, which is always aligned parallel to the centrifugal forces. The shielded thermo-couples 31 extend through the stopper 32 and are appropriately connected to sensing means (not shown).

During operation, the centrifuge means is first operated at a relatively low speed so that only few revolutions thereof occur. Upon activation of the thermal energy generating means, the indium is melted and during such slow revolution, a specified temperature gradient is attained via appropriate control of the zones 26, 27 and 28. The number of revolutions of the centrifuge is then increased in steps of about $10^{-1}g^*$. With increasing acceleration, basically two situations can occur:

1. The temperature gradient decreases constantly with increasing acceleration without brief temperature fluctuations e.g. oscillations occur.

2. The temperature gradient decreases continuously until a desired acceleration is attained.

In instances where additional increases in the acceleration occur, temperature fluctuations are observed. In both instances, the temperature gradient reverses or flips over with yet higher acceleration; with such higher acceleration the temperature gradient becomes negative so that the temperature fluctuations disappear.

If the temperature gradient is anti-parallel relative to the centrifugal acceleration, B, over the entire range $1g^* < B < \mp g^*$ there is no indication whatsoever of a non-stationary temperature gradient. In such instance, the temperature gradient remains stabile independently of the acceleration B.

It is apparent from the foregoing that the thermal convection transport increases due to the reduction of a temperature gradient with an increasing centrifugal acceleration. In an exemplary embodiment, a doped semiconductor melt (e.g. indium antimonide doped with tellurium) was grown into a monocrystal in accordance with the principles of the invention and no doping strips (striations) were found in the so-grown crystal during a metalographic examination. Accordingly, it can be assumed that the applied acceleration has a stabilizing influence on the development of the liquid/solid interphase and hence also on the radial temperature gradients. Moreover, with increasing acceleration larger monocrystalline regions or zones can occur.

The principles of the invention may also be utilized to control crystallization growth from solutions. Further, the principles of the invention may be utilized in space environments.

On earth, crystal growth speeds during the manufacture of, for example, gallium arsenide or cadmium telluride crystals in accordance with a so-called traveling heater method are on the order of magnitude of several mm per day. Such slow growth is of no economical interest. However, by applying the principles of the invention, an increasing convection yields substantially greater growth speeds with a high perfection of crystal lattice so that the traveling heater method becomes economical.

The principles of the invention apply equally well to gas phase growth and to solution or solvent growth.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not be be construed or interpreted as being restrictive or otherwise limiting of the present invention, excepting as it is set forth and defined in the hereto-appended claims.

We claim as our invention:

1. An apparatus for manufacture of highly quality crystals comprising:
    (a) a centrifuge means having a horizontally operated arm;
    (b) a temperature controllable crystal growth system positioned on said arm in a rotatable and tiltable manner;
    (c) a furnace trap mounted on said centrifuge in a symmetrical fashion relative to the center of rotation;
    (d) a shunt-motor operationally coupled to said centrifuge means for driving said centrifuge;
    (e) an electromagnetic proximity switch in operational association with said centrifuge for measuring the number of revolutions of said centrifuge;
    (f) a current supply means operationally associated with said crystal growth system;

(g) thermo-couples operationally associated with said crystal growth system for regulating and sensing the temperature thereof;

(h) acceleration-proof amplifiers positioned on said centrifuge arm for providing thermo-electrical voltages to said crystal growth system; and (i) a slip ring system mounted on said centrifuge means and operationally associated with said crystal growth system and said amplifiers for transmitting the thermo-electrical voltage from said amplifiers to said crystal growth system.

2. An apparatus as defined in claim 1, wherein the crystal growth system comprises a three-zone furnace and a heat-exchange means is associated with such furnace.

3. An apparatus as defined in claim 1, wherein said crystal growth system comprises a zone pulling apparatus.

4. An apparatus as defined in claim 1, wherein a data detection means and a control means coupled to a program generator are operationally coupled with said centrifuge means.

* * * * *